United States Patent [19]

Shrivastava et al.

[11] Patent Number: 4,647,956
[45] Date of Patent: Mar. 3, 1987

[54] BACK BIASED CMOS DEVICE WITH MEANS FOR ELIMINATING LATCHUP

[75] Inventors: Rituparna Shrivastava, Fremont; Raymond E. Bloker, Campbell; Fred B. Jenné, Los Gatos, all of Calif.

[73] Assignee: Cypress Semiconductor Corp., San Jose, Calif.

[21] Appl. No.: 700,626

[22] Filed: Feb. 12, 1985

[51] Int. Cl.$^4$ .................................... H01L 27/02
[52] U.S. Cl. ................................. 357/42; 357/48; 357/52
[58] Field of Search ..................... 357/42, 48, 52

[56] References Cited

U.S. PATENT DOCUMENTS

| | | | |
|---|---|---|---|
| 4,300,061 | 11/1981 | Mihalich et al. | 357/42 |
| 4,458,262 | 7/1984 | Chao | 357/42 |
| 4,476,476 | 10/1984 | Yu et al. | 357/42 |
| 4,480,196 | 10/1984 | Hinz et al. | 357/42 |
| 4,490,629 | 12/1984 | Barlow et al. | 357/42 |
| 4,513,309 | 4/1985 | Cricchi | 357/42 |
| 4,559,548 | 12/1985 | Iizuka et al. | 357/42 |

Primary Examiner—Edward J. Wojciechowicz
Attorney, Agent, or Firm—Owen, Wickersham & Erickson

[57] ABSTRACT

A CMOS semiconductor device which avoids latchup in the powerup mode as well as in the normal operating mode is provided. The device is provided with an on-chip back bias generator which greatly reduces the possibility of forward biasing parasitic NPNP transistors in normal operation. During the powerup mode, before the backbias voltage becomes effective, a clamp diode provided in integrated form outside a guardring surrounding the circuit elements is effective to clamp a large negative voltage that may be created by a "hot-socket" connection to an output. In a modified form of the invention, a junction field effect transistor is provided to prevent forward biasing of the parasitic transistors in a somewhat different manner.

10 Claims, 9 Drawing Figures

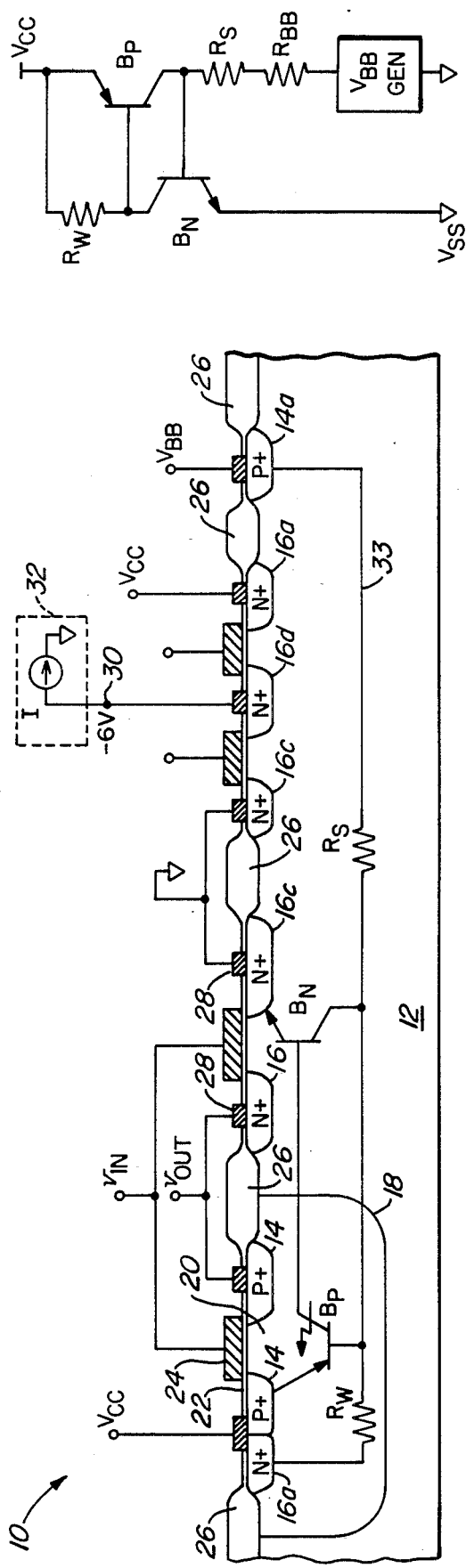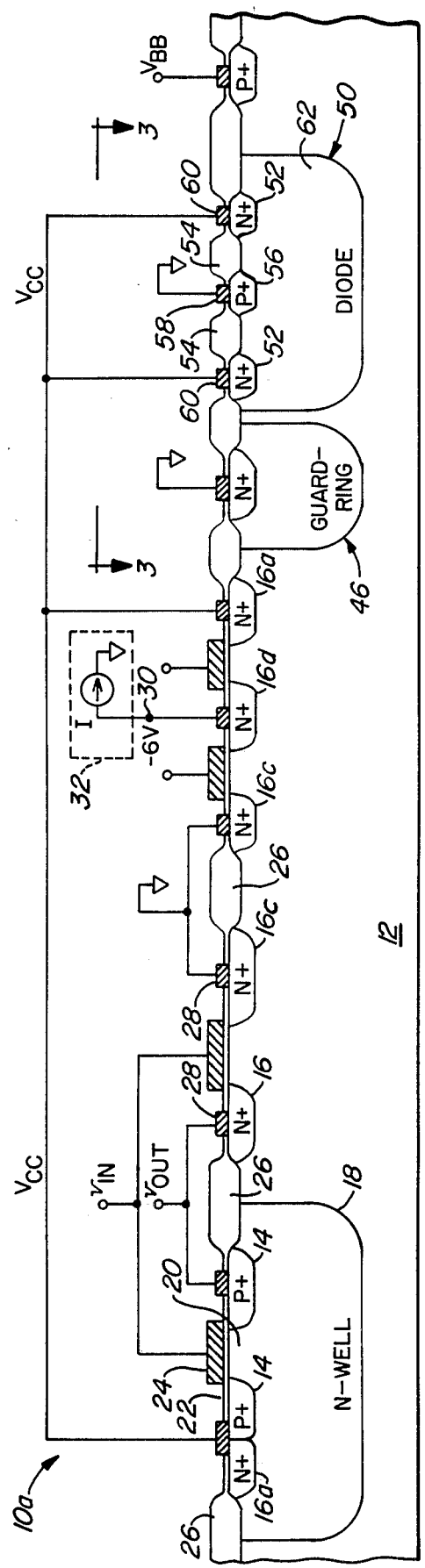
FIG._1a.
FIG._1b.
FIG._2.

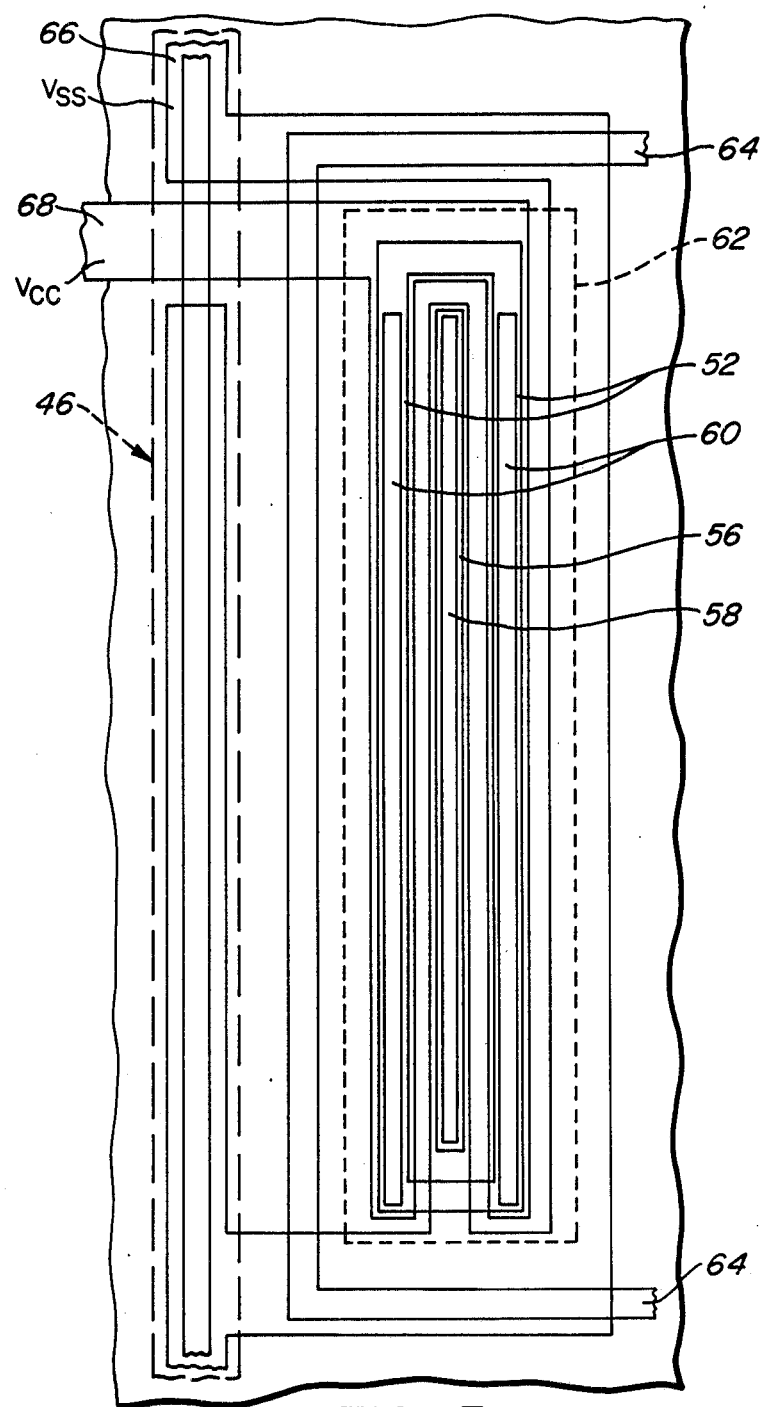
FIG._3.
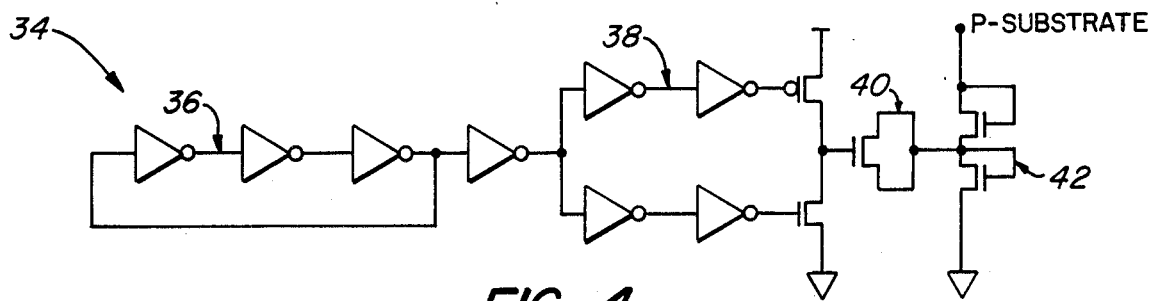
FIG._4.

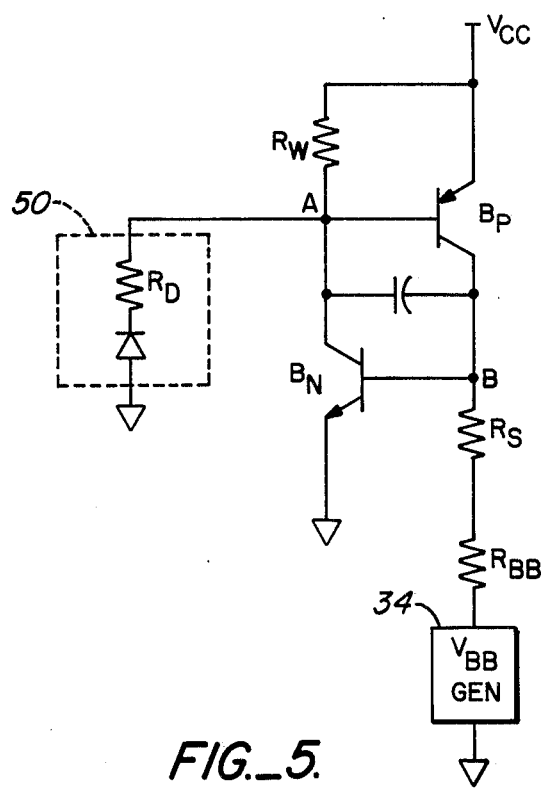
FIG._5.
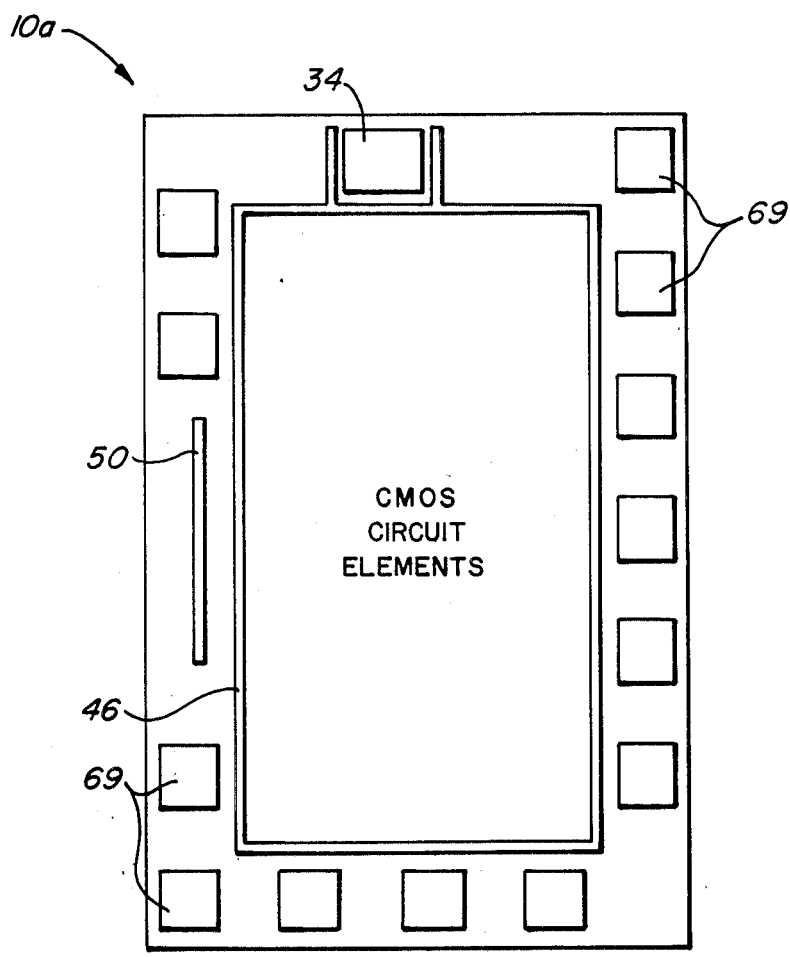
FIG._6.

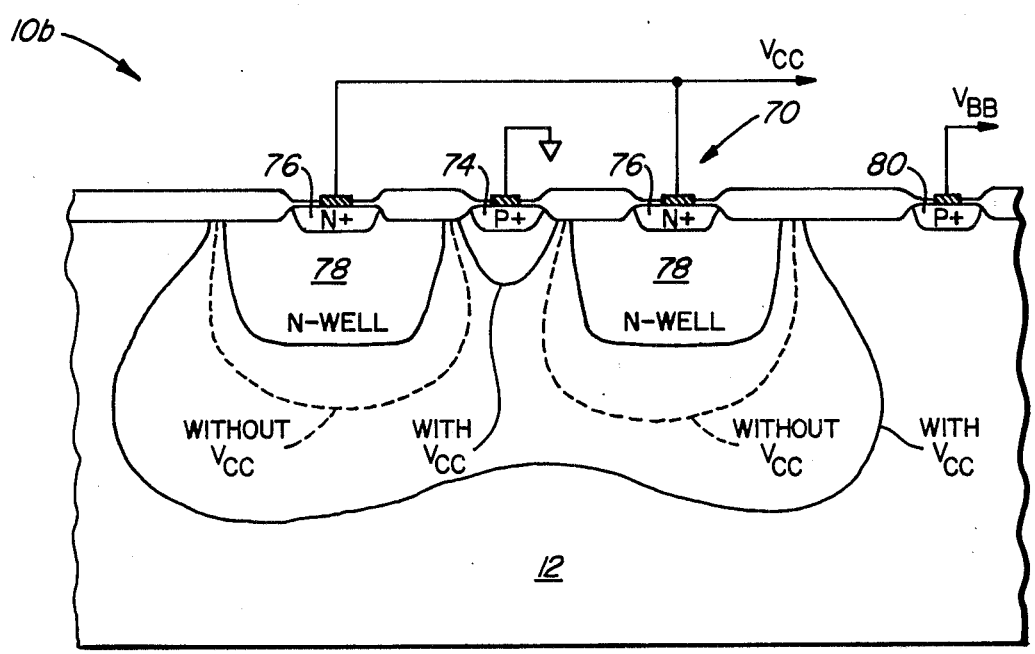
FIG._7.
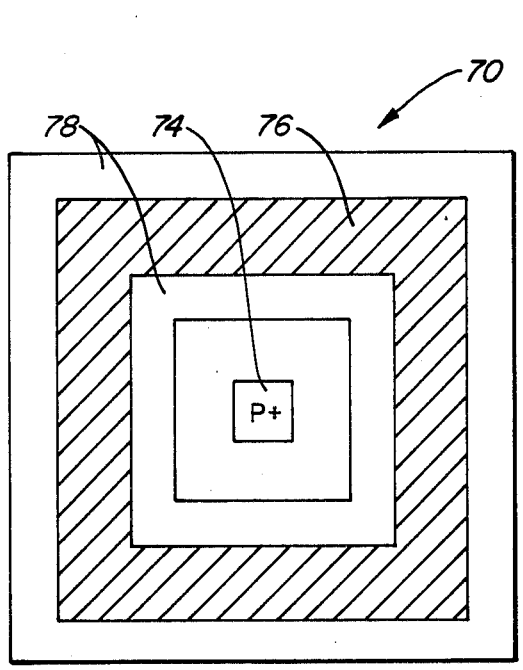
FIG._8.
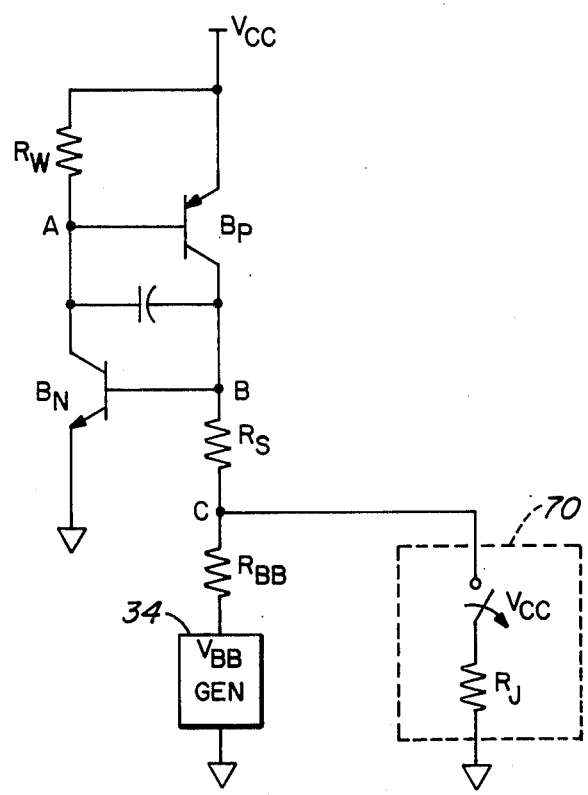
FIG._9.

BACK BIASED CMOS DEVICE WITH MEANS FOR ELIMINATING LATCHUP

This invention relates generally to semiconductors and more particularly to an improved complementary semiconductor device that overcomes the problem of latchup.

BACKGROUND OF THE INVENTION

Monolithic integrated circuit semiconductor devices using bulk CMOS technology inherently contain parasitic PNPN structures which form bipolar transistors that produce an undesired silicon controlled rectifier (SCR) action commonly known as the "latchup". This phenomena occurs when an unwanted trigger current turns on two back-to-back bipolar transistors in the device. Once turned on, the device will remain "on" even after the signal which produced the forward biasing is removed, in time shorting the power supply to ground and eventually causing destruction or malfunction of the device.

For a four layer PNPN structure to latchup, the following conditions must be met in a n-well type CMOS device:

1. Both of the parasitic bipolar transistors formed within the CMOS device must be biased into active state (emitter-base junctions forward biased). This can happen if lateral currents of sufficient magnitude are present to cause the required voltage drops across the substrate and the n-well resistances. Such currents can be caused by ionizing radiation such as X-rays, alpha particles or gamma rays; overvoltage stress in the applied terminal voltage ($V_{CC}-V_{SS}$) resulting in an avalanche current from the reverse biased n-well to substrate junction; voltage transients on the power supply line resulting in a displacement current from the n-well to substrate depletion layer capacitance, $CdV_{CC}/dt$; hot electron substrate current from short channel devices (p-channel devices typically exhibit 3 orders of magnitude less substrate current than comparable n-channel devices).

2. The parasitic bipolar current gain product $B_N * B_P$ must be sufficiently high to allow regeneration. For a CMOS inverter this condition is:

$$B_N * B_P > \text{or} = \frac{I_{CC} + I_{RS} * B_N}{I_{CC} - I_{RS} + I_{RW}(1 + (1/B_N))}$$

where $I_{cc}$ is the maximum current available from the power supply and $R_S$ and $R_W$ are the substrate and n-well resistances, respectively. For $R_S$ and $R_W \rightarrow$ infinity, the condition reduces to $B_N * B_P >$ or $= 1$ which makes latchup very likely. The higher the values of resistances $R_S$ and $R_W$, the easier it is for a trigger current to forward bias the transistor junctions, and hence the easier to latchup. From this it is obvious that a sufficient condition to prevent latchup would be to ensure that $B_N * B_P < 1$. This, however, is difficult to implement in practice.

3. The bias supply must be capable of sourcing current equal to or greater than the holding current. This current depends on $R_S$ and $R_W$. As $R_S$, $R_W$ or both approach zero, the supply current necessary to sustain latchup becomes infinite and latchup becomes impossible.

Heretofore various methods to control latchup in CMOS devices fell into one of the following categories: (a) layout techniques to prevent the emitter base junctions from becoming forward biased (e.g. by proper placement of $V_{SS}$ and $V_{CC}$ contacts), (b) minimizing the current gain product of the parasitic bipolar transistor by either layout techniques (such as use of guardings) or lifetime reduction techniques and (c) process architecture (e.g., use of buried layer or retrograde wells) to reduce the current gains.

Another approach that has been suggested for solving the latchup problem in bulk CMOS is the use of backbias. Using backbias, the p-substrate of a CMOS device is at a negative potential ($V_{BB}$) e.g., $-3$ volts, as a result of either an externally applied voltage or an on-chip backbias generator. This results in the emitter base junction of the lateral n+ p n transistor being reverse biased at $-3$ volts. Since this junction needs to be forward biased for latchup to take place, this extra margin of $-3$ volts would help deter the latchup. The use of backbias also is desirable from several other considerations. It helps in achieving higher speeds by reduced junction capacitances as a result of reversed biased junctions. Also, it allows required active and field threshold values to be obtained with smaller dopings which indirectly results in lower capacitances. Other advantages such as reduced body effect of n-channel devices and better punchthrough control would also be obtained by using backbias.

However, despite its advantages, backbias heretofore has not been used in the industry for CMOS processes because of a so-called "hot-socket" latchup condition which can be explained as follows. An on-chip backbias generator (which is the only convenient way to incorporate backbias without the chip requiring an extra pin/supply devoted to $V_{BB}$) results in a higher "internal" source impedance. During the powerup of the circuit, the substrate takes a finite amount of time to charge to the potential $V_{BB}$. During this duration, the parasitic SCR structure has a large equivalent resistance, $R_{BB}$, from the n+ p n parasitic transistor base to $V_{BB}$. Also, there exists a transient current due to the depletion junction capacitance, $CdV_{CC}/dt$ which can help the emitter-base junctions get forward biased. Both of the above can make latchup due to the internal circuit quite probable. Also, if the field thresholds without backbias are low, any subthreshold field leakage that may exist can also contribute to trigger latchup.

This situation becomes significantly worse when a current is being drawn from one of the outputs of the circuit by an external source during the powerup phase of the device. Under this condition, the p-substrate is at a negative potential determined by the external source, $-5.3$ volts. Since the $V_{CC}$ terminal of the circuit is floating before the power is applied, all the n-wells in the circuit which are normally connected to $V_{CC}$ terminal, follow the substrate potential (less a diode drop). Thus all the n-wells would be at a nominal potential of $-6$ volts. As soon as $V_{CC}$ is applied, the p+ diffusion areas in the n-wells which form the sources of the p-channel transistor and are connected to $V_{CC}$, start to inject minority carriers into the n-well causing the base-emitter junctions to become forward biased. This happens despite the fact that the n-wells connected to $V_{CC}$ supply themselves are moving towards $V_{CC}$ in potential, because only a local forward biasing is requiring for the above injection to take place. Once the p+ n p bipolar transistor is in an active region, and starts to inject a collector current into the substrate, the circuit may go into latchup depending on the magnitude of the current being drawn from the output, since it is relatively easy to forward bias the other n+ p n transistor due to its high $R_{BB}$ during powerup and the absence of $V_{BB}$. In the preceding discussion, it is assumed that all the three conditions required for latchup described previously for the non-backbias situation are also satisfied, which is typically the case in practice.

The threshold of latchup is specified by the minimum current that is required to be drawn from the output for the above "hot-socket" latchup condition to take place. Typically, this current can be as low as 20 mA which is unacceptable for reliable parts. The present invention solves this latchup problem and provides a solution that raises the latchup threshold to several magnitudes of the aforesaid minimum current level, thereby eliminating the the problem in CMOS devices.

SUMMARY AND OBJECTS OF THE INVENTION

In accordance with the principles of the invention, a CMOS device with an on-chip backbias generator is provided having a $V_{SS}$ guardring surrounding the active circuit elements and a p+ n diode formed inside an n-well and located outside the guardring. This diode is connected to all of the n-wells of the circuit and functions to clamp the n-well potential so that it is limited to only a diode drop below $V_{SS}$ (ground) potential. The result is that the powerup latchup immunity level during the "hot-socket" period when the backbias is inoperative is increased to the extent that the latchup problem is eliminated. When the aforesaid clamp diode is properly sized and located on the CMOS substrate according to the invention, the output current for the diode equipped CMOS device can be easily increased to a level, e.g., two hundred milliamps (mA), which effectively eliminates any latchup.

In a modified form of the invention an integrated junction field effect transistor is used in lieu of the clamp diode in a CMOS device, and it functions in a somewhat different manner to eliminate the latchup problem in the powerup mode. This JFET operates as a controlled switch to close the p+ $V_{SS}$ connection to the substrate during the powerup mode so that the substrate has an effective low resistance to $V_{SS}$ which eliminates the "hot-socket" latchup. As the power supply voltage $V_{CC}$ comes on, the substrate is disconnected from $V_{SS}$ and the $V_{BB}$ backbias potential becomes effective for normal operation.

Accordingly, one object of the present invention is to provide a CMOS integrated circuit device utilizing an on-chip backbias generator which essentially eliminates any latchup problem even in its power-up mode.

Another object of the present invention is to provide a CMOS integrated circuit device with backbias which prevents latchup by means of a diode located outside of a guardring around the active circuit elements.

Still another object of the present invention is to provide a CMOS integrated circuit device that uses on-chip backbias to increase speed and yet eliminates latchup during the powerup mode by means of an on-chip clamp diode that: (1) is located outside of a guardring for the circuit; (2) has a relatively low forward resistance; and (3) is located as far away from the device input pads as possible.

Another object of the invention is to provide a CMOS device having an on-chip backbias generator which includes integral structure forming a junction field effect transistor that eliminates latchup of the device in the powerup mode.

Yet another object of the present invention is to provide a CMOS integrated circuit device that eliminates the latchup problem by means that are particularly well adapted for ease and economy of fabrication.

Other objects, advantages and features of the invention will become apparent from the following detailed description of embodiments thereof, presented in conjunction with the accompanying drawing.

BRIEF DESCRIPTION OF THE DRAWING

FIG. 1a is a fragmentary view in cross section of a semiconductor device which backbias, including a diagrammatic representation of PNPN bipolar transistors that are formed internally during operation of the device;

FIG. 1b is a simplified circuit diagram for the PNPN transistors shown in FIG. 1a;

FIG. 2 is a fragmentary plan view in cross section of a semiconductor device embodying principles of the present invention;

FIG. 3 is a fragmentary plan view of a portion of the device shown in FIG. 2 and taken along line 3—3 thereof;

FIG. 4 is a circuit diagram of an on-chip backbias generator;

FIG. 5 is a diagrammatic view of the PNPN transistors of a CMOS device showing the anti-latchup function of the clamp diode according to the present invention;

FIG. 6 is diagrammatic plan view of a CMOS integrated circuit device embodying the present invention;

FIG. 7 is a fragmentary view in cross section of a semiconductor device embodying a modified form of the present invention that utilizes a junction field effect transistor for eliminating latchup;

FIG. 8 is a plan view of the junction field effect transistor shown in FIG. 7; and FIG. 9 is a diagrammatic view of PNPN transistor of a CMOS device showing the anti-latchup function of the junction field-effect transistor according to the invention.

DETAILED DESCRIPTION OF EMBODIMENT

With reference to the drawing, FIG. 1a shows in cross section a portion of an integrated circuit CMOS semiconductor device 10 formed on p-type substrate 12. In this device, which is shown to illustrate the "hot-socket" latchup problem, a pattern of pairs of p+ and n+ source and drain regions 14 and 16 are provided in the conventional manner on the substrate to form an element such as an inverter of a complementary or CMOS device. Some p+ regions 14 are situated within n-well regions 18 within the p-type substrate material. Normally, various forms of such CMOS devices may have a large plurality of such p+ and n+ transistor pairs that are interconnected to form logic circuitry and/or memory array portions of the circuit. As shown, between each pair of p+ and n+ source and drain regions is a conductive channel region 20 covered by an insulating layer 22. The channel regions for each complementary pair of p+ and n+ regions are covered by gate electrodes 24 connected to a logic input voltage (Vin) for the circuit, as shown diagrammatically.

The insulating upper oxide layer 22 provided for the device 10, in addition to covering the p+ and n+ regions 14 and 16, and the gate regions 20, is contiguous to thick oxide regions 26 that are located between p+ and n+ pairs in the well known manner. Provided at designated areas over the upper oxide layer 22 is a metallized layer 28 which extends through the upper oxide layer at predetermined locations to contact directly certain p+ or n+ regions. This metallized layer is patterned to form bus lines, conduits and interconnect lines for the circuit, each of which may be connected to a particular voltage level required to operate the circuit. For example, a typical metallized conductor between the p+ and n+ regions of an active complementary transistor is connected to the circuit logic output, Vout.

The device of FIG. 1a is provided with an n+ region 16a connected to the chip power source $V_{CC}$ and a p+ region 14a connected to a backbias voltage source $V_{BB}$. Also provided on the device 10 is an output buffer whose purpose is to provide compatability between the part which uses CMOS and the outside world which is usually TTL. This output buffer is comprised of a pair of n+ regions 16c connected to ground or $V_{SS}$ and spaced from another n+ region 16d having a contact which is shown (diagrammatically) connected to an output designated by numeral 30. As shown connected to the output 30 within a dotted line is an equivalent circuit 32 representing a worse case TTL device input that could cause a latchup condition.

Superimposed on the cross-sectional view of FIG. 1 is a diagrammatic representation of device 10, are two bipolar parasitic transistors $B_P$ and $B_N$ which are formed inherently within the CMOS structure of the device during its operation. Within the n-well 18 the emitter of a PNP transistor $B_P$ is formed by the p+ junction with the n-well which comprises its base, and the collector thereof is formed by the n-well junction with the p-substrate 12. The latter collector is connected to the base of the second or NPN transistor $B_N$ which is formed outside of the n-well. The emitter of this latter transistor is formed by the junction of the n+ region 16 with the p-substrate and its collector is formed by the junction between the p-substrate and the n-well 18 as indicated by a lead line 33 extending from n+ region 16 to a p+ region 14. The resistance provided by the n-well between the n+ region and the base of transistor $B_N$ is designated $R_W$ and the resistance of the p-substrate provided between the collector of transistor and the p+ region 14 is designated $R_S$. In the device of FIG. 1a, a backbias voltage $V_{BB}$ (e.g., $-3$ volts) is applied at a contact for the p+ region 14a in a typical case, and the supply voltage $V_{CC}$ is connected to a contact on the adjacent n+ region 16a.

The elements that create the latchup problem are illustrated by the circuit diagram of FIG. 1b. When the device of FIG. 1a is plugged in, the output buffer connected to a current source such as TTL circuit 32 is activated and commences to draw current which produces a voltage drop of $-6$ volts while initially the supply voltage $V_{CC}$ is floating. The charge pump or on-chip generator circuit providing the backbias voltage $V_{BB}$ takes some finite time to build up, so initially its minus 3 volts does not exist. Also, because of the backbias circuitry, there is present a high resistance $R_{BB}$ in addition to the internal resistance $R_S$. Therefore initially the NPN transistor $B_N$ has a very high resistance before it sees any potential like $V_{SS}$, so any small current now can trigger the latchup of transistors $B_P$ and $B_N$. That is, if lateral currents $I_{RS}$ and $I_{RW}$ of sufficient magnitude are present to cause the required voltage drops across the substrate and the n-well resistances, $R_S$ and $R_W$, respectively.

The situation with the circuit of FIG. 1a becomes significantly worse if a current is being drawn from one of the circuit outputs by an external source (such as the circuit 32) during the powerup mode. Under this condition, the p-substrate is at a negative potential determined by the external source, say $-5.3$ volts. Since the $V_{CC}$ terminal of the circuit is floating before the power is applied, all the n-wells in the circuit which are normally connected to the $V_{CC}$ terminal, follow the substrate potential (less a diode drop). Thus all the n-wells 18 would be at a nominal potential of $-6$ volts. As soon as $V_{CC}$ is applied, the p+ diffusion areas 14 in the n-wells which form the sources of the p-channel transistor, and are connected to $V_{CC}$ become forward biased and start to inject minority carriers into the n-well. This happens despite the fact that the n-wells connected to $V_{CC}$ supply are themselves moving towards $V_{CC}$ in potential, because only a local forward biasing is required for the above injection to take place. Once the p+ n p bipolar transistor is in an active region, and starts to inject a collector current into the substrate, the circuit may go into latchup depending on the magnitude of the current being drawn from the output, since it is relatively easy to forward bias the other n+ p n transistor due to its high $R_{BB}$ resistance during powerup and the absence of $V_{BB}$. In the preceding discussion, it is assumed that three conditions required for latchup described earlier are satisfied. This is typically the case in practice.

The CMOS device 10a utilizes an on-chip backbias generator rather than relying on an additional external power source for a backbias voltage, which is impractical. Such on-chip voltage generators have been used on NMOS devices and are well known in the art. An example of a suitable circuit adaptable for implementation with CMOS elements and designated by the numeral 34 is shown in FIG. 4. Generally this voltage generator or charge pump comprises a ring oscillator 36 comprised of a plurality of inverters with a feedback loop that produces a continuous train of pulses and is connected through a buffer circuit 38 to a clamping circuit. The clamping circuit consists of a MOS capacitor 40 connected to a pair of MOS diodes 42 and functions to inject electrons into the substrate which produces a desired potential (e.g., $-3$ volts). The diode 42 is comprised of a pair of MOS transistors, one of which is connected to $V_{SS}$, the other being connected to the p-substrate 12. While the circuit 34 is representative of one on-chip backbias generator, other such circuits adaptable for use on CMOS devices could be utilized within the scope of the invention. This circuit 34 produces the desired backbias voltage (e.g., $-3$ volts), but as discussed above, this voltage is not produced immediately when the device is powered up.

A fragmentary cross-sectional view of a CMOS device 10a embodying principles of the invention is shown in FIG. 2. In this figure, all of the circuit elements as shown in FIG. 1a and described above are included and in the device 10a, all of these circuit elements are surrounded by a continuous guardring 46. This guardring, which functions to block the carriers in the substrate and thereby isolate the circuit elements from carriers which may be generated outside the guardring. Here, the guardring 46 is comprised of an n-well of uniform width strapped by an n+ region 48 that is preferably continuous. Contacts on the n+ region of the guardring are connected to $V_{SS}$.

Located outside the guardring on the device 10a, and separated from it by a thick oxide region 26, in accordance with the present invention, is a clamp diode 50. As shown in FIGS. 2 and 3, this diode is formed by a pair of n+ regions 52 which are spaced by intermediate oxide regions 54 from opposite sides of a central p+ region 56. The latter is covered by a metallized layer 58 connected to $V_{SS}$ or ground and the n+ regions are covered by metallized regions 60 which are both connected to the circuit power supply ($V_{CC}$). These n+ and p+ regions are all situated within an n-well 62 having a different n-type conductivity than the n+ regions.

As shown in the fragmentary plan view of device 10a in FIG. 3, the clamp diode 50 has a rectangular configuration with its longest side parallel to and spaced from the guardring 46. In order that the diode have a relatively low forward resistance (e.g., 2-4 ohms), its configuration should be perimeter intensive rather than area intensive. Thus, a relatively long and narrow shaped form by the n+ regions 52 is desired. For example, typical diode dimensions for the CMOS device 10 may be in the range of 25 microns by 750 microns. However the overall dimensions of the diode and the number of n+ and p+ fingers forming the diode can be varied to accommodate the space and resistance requirements of different CMOS circuits. The n+ and p+ fingers of the diode 50 are preferably surrounded by and protected from extraneous carriers by a barrier region 64 having a continuous p+ tap and connected to a $V_{BB}$ ring from the $V_{BB}$ operation. An overlaying metallization layer is used to form connecting conduits 66 an 68 that supply $V_{SS}$ and $V_{CC}$ voltages to the diode.

The preferred location of the diode of the semiconductor device 10a relative to other components thereof is illustrated schematically in FIG. 6. As shown, the diode 50 should be located outside of the guardring 46 as far away from input pads 69 of the circuit device as possible in order to avoid the formation of an SCR of its own during the powerup condition with an input at a negative voltage. While this condition does not pose any threat of a circuit latchup, it may temporarily increase the supply current when the circuit power ($V_{CC}$) is applied. This is another reason why a long, narrow diode configuration rather than a square diode is preferred.

The operation of the clamp diode 50 in preventing hot-socket latchup during the powerup mode may be readily described with reference to FIG. 5. Here, the parasitic bipolar transistors $B_N$ and $B_P$ are shown as they are inherently electrically connected in the device 10a to the various voltage potentials $V_{SS}$, $V_{CC}$ and $V_{BB}$. The diode 50 with its resistance $R_D$ is connected directly to the n-wells 18 of the CMOS circuit which are indicated by the point A in FIG. 5. As previously described, before the device 10a is plugged into an active system in a "hot-socket" situation, the diode 50 clamps node A to approximately −0.6 volts, thereby preventing transistor $B_P$ from going into a heavy forward biased condition. Without diode 50, as pointed out previously, node A would be a −6 volts potential due to the effect of the outside circuit to which the part is being connected.

In a modified form of the invention, the "hot-socket" latchup problem may also be eliminated by use of a junction field effect transistor (JFET) 70 in lieu of the clamp diode 50. Thus, it is applicable for use with an n-well type CMOS device having an on-chip backbias generator as previously described. As shown in FIG. 7 a JFET 70 is provided as an integral part of an n-well type CMOS structure 10b. As in the case of the clamp diode 50, this JFET would be formed in the device substrate outside of a guardring 46 surrounding the circuit elements and located at a point that is electrically between the backbias generator 34 and the circuit elements. Structurally, the JFET comprises an annular or doughnut shaped element 72 surrounding a p+ region 74 (e.g., 4 microns square) having a contact connected to $V_{SS}$. Spaced from this p+ region is an annular square-shaped n+ region 76 having a width somewhat larger (e.g., 5 microns) than the p+ region 74 and situated within an n-well 78 that extends from both sides of the n+ region and has an overall width of around 10–12 microns. Contact pads on the n+ region 76 are connected to the $V_{CC}$ terminal of the device. A p+ region 80 adjacent the JFET is provided with a contact connected to the backbias generator.

The operation and function of JFET in preventing latchup during the powerup mode may be described with reference to FIGS. 7 and 9. In FIG. 9 which shows the parasitic transistors schematically, the JFET 70 is shown connected to a point C which in effect is the substrate between the circuit elements and the $V_{BB}$ generator. Since the $V_{BB}$ generator is temporarily inoperative during powerup, it is generally the function of the JFET to keep point C (the substrate) connected to $V_{SS}$ through a low resistance $R_J$ (of the JFET) as the $V_{CC}$ potential is rising to its nominal level. When this occurs, the JFET pinches off and disconnects the $V_{SS}$ potential at the p+ region 74 from the substrate. In other words, the JFET acts like a switch, as shown diagrammatically in FIG. 9 and by the cross-sectional view of FIG. 7.

This switch is embodied by the p+ region 74, connected to $V_{SS}$ in the p-substrate surrounded by the n+ region 76 within the n-well 78 and connected to $V_{CC}$. Before and during powerup when a current is being drawn from an output of the device, the n-well $V_{CC}$ terminal is one diode drop below the p-substrate potential. This results in a small n-well depletion width, as indicated by the dotted line in FIG. 7. The p+ to n-well spacing (e.g., 4 microns on all sides of the p+ region) can be designed such that under this condition, the channel resistance of the JFET is very small, typically about one hundred ohms. As the $V_{CC}$ is applied, the n-well potential increases towards $V_{CC}$ which increases the n-well to substrate depletion width. The p+ edge to n-well spacing for the JFET (e.g., 4 microns) is designed so that the channel completely closes and thus disconnects the p+ ($V_{SS}$) connection to the substrate. Once this $V_{SS}$ switch is disconnected, the backbias generator brings the substrate to the $V_{BB}$ potential and normal operation of the circuit can take place whereby the backbias voltage is effective to prevent forward biasing of the parasitic transistors and thus latchup as previously described. In summary, in a "hot-socket" situation, the relatively small JFET resistance $R_J$ even when combined with resistance $R_S$ at the base of parasitic transistor $B_N$, is so low that an unusually high trigger current would be required for latchup as the $V_{CC}$ is rising to its normal operating level.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

What is claimed is:

1. A four layer CMOS integrated circuit semiconductor device comprising:

a semiconductor substrate having a p-type conductivity;

an integrated circuit formed in a surface area of said substrate, said circuit having elements including a plurality of n-well regions, n+ and p+ diffusions in said n-well regions and other n+ and p+ diffusions outside of said n-well regions, means interconnecting said diffusions in a predetermined manner and integral lead means forming a network connecting said n-well regions to a $V_{CC}$ power supply;

means among said circuit elements forming an output buffer and connected to an output terminal of said device adapted for connection with an external electrical circuit that normally draws current during the powerup mode for said device;

means in said substrate forming a guardring surrounding said integrated circuit elements;

means in said substrate forming a backbias generator for producing a backbias voltage to said substrate;

latchup prevention means in said substrate located outside of and spaced from said guardring comprising an integrated sub-circuit including n+ and p+ diffusions within an n-well region and connected to said $V_{CC}$ power supply network for said integrated circuit, said latchup prevention means being operative to limit the forward biasing of parasitic transistors inherently formed within said four layer integrated circuit during the powerup phase of said device.

2. The CMOS integrated circuit device of claim 1 wherein said means for preventing latchup during the powerup phase is a clamp diode located outside of said guardring and connected electrically to said n-well regions of said circuit by said $V_{CC}$ network.

3. The CMOS integrated circuit device of claim 2 wherein said clamp diode is comprised of a plurality of elongated n+ and p+ diffusions within an n-well region in said substrate.

4. The CMOS integrated circuit device of claim 2 wherein said clamp diode has a relatively low forward resistance of not more than 4 ohms.

5. The CMOS integrated circuit device of claim 2 wherein said clamp diode has an overall length that is at least 30 times its width.

6. The CMOS integrated circuit device of claim 2 including a p+ protective diffusion surrounding said clamp diode.

7. The CMOS integrated circuit device of claim 1 wherein said means for preventing latchup of the CMOS circuit in the powerup mode is a junction field effect transistor.

8. The CMOS integrated circuit device of claim 7 wherein said junction field effect transistor comprises a central p+ diffusion connected to ground potential ($V_{SS}$) a continuous n-well region spaced from and surrounding said p+ diffusion and an n+ diffusion connected to the device power supply ($V_{CC}$) within said n-well region, said n-well region and its included n+ diffusion being close enough to said p+ diffusion so that when power is applied, the n-well depletion region will expand to close off any conductive path from said p+ diffusion to the substrate below said junction field effect transistor.

9. The CMOS integrated circuit device of claim 8 wherein said p+ diffusion is essentially square shaped with a side dimension of around 4 microns and said n-well region is spaced about 4 microns from the sides of said p+ diffusion.

10. A semiconductor device comprising:

a semiconductor substrate of a first conductivity type;

a well region having a second conductivity type in the surface area of said semiconductor substrate;

first and second semiconductor regions of the first conductivity type formed in the surface area of said substrate;

third and fourth semiconductor regions of a second conductivity type formed in the surface area of said substrate;

a first gate electrode insulatively formed on a surface area of said substrate which lies between said first and second semiconductor regions to form a first transistor;

a second gate electrode insulatively arranged on the surface area of said well region which lies between said third and fourth semiconductor regions to form a second transistor;

means for interconnecting said first and second transistors to form a complementary metal oxide semiconductor element;

voltage generator means on said device for applying a reverse bias voltage to said substrate;

means forming a guardring in the surface of said substrate surrounding said first and second transistors; and sub-circuit means of additional semiconductor regions forming a clamp diode in the surface of said substrate outside of said guardring said sub-circuit means and said well region being connected to a conductive network between an external power source for said device and ground potential to limit the forward biasing of parasitic transistors formed in the device and thereby prevent latchup of the device in its powerup mode.

* * * * *